United States Patent [19]

Imaizumi et al.

[11] Patent Number: 5,266,127
[45] Date of Patent: Nov. 30, 1993

[54] EPITAXIAL PROCESS FOR III-V COMPOUND SEMICONDUCTOR

[75] Inventors: Toyoaki Imaizumi; Mitsuaki Seiwa, both of Toda, Japan

[73] Assignee: Nippon Mining Co., Ltd., Tokyo, Japan

[21] Appl. No.: 780,284

[22] Filed: Oct. 22, 1991

[30] Foreign Application Priority Data

Oct. 25, 1990 [JP] Japan .................. 2-287954

[51] Int. Cl.⁵ .......................................... C30B 25/14
[52] U.S. Cl. ..................... 156/611; 156/606; 156/610; 156/DIG. 70; 437/102; 437/104; 437/112
[58] Field of Search ............ 156/606, 609, 610, 611, 156/DIG. 70; 437/102, 104, 112, 465; 148/12, DIG. 176

[56] References Cited

U.S. PATENT DOCUMENTS

| | | | |
|---|---|---|---|
| 3,901,746 | 8/1975 | Boucher | 156/610 |
| 4,007,074 | 2/1977 | Ogirima et al. | 156/610 |
| 4,507,169 | 3/1985 | Nogami | 156/606 |
| 4,645,689 | 2/1987 | Cox | 156/DIG. 70 |
| 4,801,557 | 1/1989 | Wessels et al. | 156/610 |

FOREIGN PATENT DOCUMENTS

| | | | |
|---|---|---|---|
| 58-18919 | 2/1983 | Japan | 156/610 |
| 63-228716 | 9/1988 | Japan | 156/611 |
| 3-159993 | 7/1991 | Japan | 156/611 |

OTHER PUBLICATIONS

Jain et al, "Vapour phase Epitaxial Growth of GaAs", Progress in Crystal Growth and Characterizations, vol. 9, No. 1 (1984) pp. 75, 86 and 87.

*Primary Examiner*—Robert Kunemund

[57] ABSTRACT

A vapor-phase epitaxial process enabling easy growth of a III-V compound semiconductor layer including a δ-doped layer requires essentially no change or rearrangement of the conventional vapor-phase epitaxial reactor system but only a simple change in the method of controlling the system. The epitaxial process includes the step of feeding an epitaxial growth gas into a reactor vessel containing a III group element as a raw material and an epitaxial substrate made of a semiconductor to epitaxially grow a layer made of a III-V compound semiconductor on the substrate by the chloride CVD process. The epitaxial process also includes the steps of displacing the gas in the reactor vessel with an inert gas, feeding an epitaxial growth gas consisting of a chloride of a V group element and a carrier gas to grow a buffer layer on the substrate, interrupting the epitaxial growth gas feeding step, feeding only the carrier gas to a boat for raw material in the reactor vessel for causing a melt of the III group element to appear on the surface of a melt in the boat, and feeding the epitaxial growth gas to the substrate to grow a semiconductor layer doped by an impurity in a δ-function deposition profile.

15 Claims, 7 Drawing Sheets

FIG. 3

| | | | | | |
|---|---|---|---|---|---|
| LINE C | N2 800cc/min | H2+AsCl3 800cc/min | H2 800cc/min | H2+AsCl3 800cc/min | H2 800cc/min | N2 800cc/min |

| LINE B | N2 800cc/min | H2+AsCl3 200cc/min | H2 1000cc/min | | H2+AsCl3 1000cc/min | H2 1000cc/min | N2 800cc/min |

LINE A: DOPANT 30cc/min

| T0 | T1 | T2 | T3 | T4 | T5 | T6 | T7 | T8 | T9 | T10 |
|----|----|----|----|----|----|----|----|----|----|-----|
| 15MIN | 40MIN | 60MIN | 10MIN | 5MIN | 5MIN | 3MIN | 3S | 15MIN | 5MIN | |

5,266,127

EPITAXIAL PROCESS FOR III-V COMPOUND SEMICONDUCTOR

BACKGROUND OF THE INVENTION

1. Field of the Invention

The present invention relates to a process for vapor-phase epitaxial growth of a III-V compound semiconductor by the chloride CVD process. It also relates to a process for vapor-phase epitaxial growth of a semiconductor layer including a δ-doped layer in which an impurity dopes the semiconductor layer in a δ-function deposition profile.

2. Description of the Related Art

FIG. 8 illustrates a prior-art vapor-phase epitaxial reactor system for use in vapor-phase epitaxy on a substrate for a III-V compound semiconductor, such as gallium arsenide (GaAs), gallium phosphide (GaP), indium phosphide (InP) or indium arsenide (InAs), added with an impurity.

This vapor-phase epitaxial reactor system comprises a horizontal cylindrical reactor vessel 1 made of quartz and an electric furnace 2. The electric furnace 2 is designed to control the temperature distribution along the longitudinal axis of the reactor vessel 1. When the vapor-phase expitaxial reactor system is used for growing a gallium-arsenide crystal, a boat 4 for raw material is placed in the reactor vessel 1 at its upstream end (i.e., at the left-hand end). A source of gallium 3 is placed in the boat 4 and an epitaxial substrate of gallium arsenide 5 is placed near the downstream end of the reactor vessel 1.

The upstream end of the reactor vessel 1 communicates with a first gas-introduction conduit 6a and a parallel second gas-introduction conduit 6b. The gas-introduction conduits 6a and 6b feed gases to the substrate 5 upstream thereof, bypassing the boat 4. The upstream end of the reactor vessel 1 also communicates with a third gas-introduction conduit 6c feeding a gas to the boat 4.

The second gas-introduction conduit 6b has an intermediate bubbler 8b which communicates therewith and contains liquid arsenic trichloride ($AsCl_3$). The third gas-introduction conduit 6c has an intermediate bubbler 8c which communicates therewith and contains liquid arsenic trichloride. The gas-introduction conduits 6b and 6c receive hydrogen gas from the outside and blow it into the liquid arsenic trichloride contained in the bubblers 8b and 8c so as to feed a mixture of arsenic trichloride gas and hydrogen gas into the reactor vessel 1. The bubblers 8b and 8c are placed in thermostatic ovens (not shown) so as to control the amount of the liquid arsenic trichloride evaporated. A waste gas discharge conduit 9 communicates with the downstream end of the reactor vessel 1.

The gas feed line including the first gas-introduction conduit 6a will hereinafter be referred to as a line A, the gas feed line including the bubbler 8b and the second gas-introduction conduit 6b as a line B, and the gas feed line including the bubbler 8c and the third gas-introduction conduit 6c as a line C.

In semiconductor devices having a gallium arsenide substrate, it has recently become the practice to provide the substrate with a δ-doped layer since an FET in a semiconductor device which includes a δ-doped layer in its vapor-phase epitaxial layer has a higher gm.

However, it is hard to grow a vapor-phase epitaxial layer of gallium arsenide crystal including the δ-doped layer by the chloride CVD process using the vapor-phase epitaxial reactor system of FIG. 8 because the epitaxial growth rate is as high as 10 μm/hr and the epitaxy cannot be interrupted. FIG. 9 shows a vapor-phase epitaxial reactor system developed for overcoming this problem. This system includes two chambers for sourcing III group elements and during epitaxy the epitaxial substrate is transferred from one growth zone facing one chamber for sourcing a III group element to another growth zone facing the other chamber for sourcing another III group element so as to grow the δ-doped layer. The process using the FIG. 9 system requires two sourcing chambers and is therefore complex and costly.

SUMMARY OF THE INVENTION

An object of the present invention is to provide a vapor-phase epitaxial process for easily growing a III-V compound semiconductor layer including a δ-doped layer which requires essentially no change or rearrangement of the conventional vapor-phase epitaxial reactor system but only a simple change in the method of controlling the system, In an epitaxial process for a III-V compound semiconductor including the step of feeding an epitaxial growth gas into a reactor vessel containing a III group element as a raw material source and an epitaxial substrate made of a semiconductor to epitaxially grow a layer of a III-V group compound semiconductor on the substrate by the chloride CVD process, the invention provides an epitaxial process comprising the steps of: displacing a gas contained in the reactor vessel with an inert gas; feeding a chloride of a V group element to grow a buffer layer on the substrate; interrupting the feeding of the epitaxial growth gas; feeding only a carrier gas to a boat for raw material in the reactor vessel for causing a melt of the III group element to appear on the surface of a melt in the boat; and feeding the epitaxial growth gas to the substrate to grow a semiconductor layer doped with an impurity in a δ-function deposition profile.

A doping gas may be optionally fed to the substrate for a short time immediately after the epitaxial growth gas feeding step starts after the appearance of the melt of the III group element. When the impurity is silicon, a doping gas need not be positively fed because a quartz reactor vessel provides the dopant.

BRIEF DESCRIPTION OF THE DRAWINGS

FIG. 3 is a timing chart for gas feed control in EXAMPLE 1 of the process according to the present invention;

DESCRIPTION OF THE INVENTION

Figure 1:
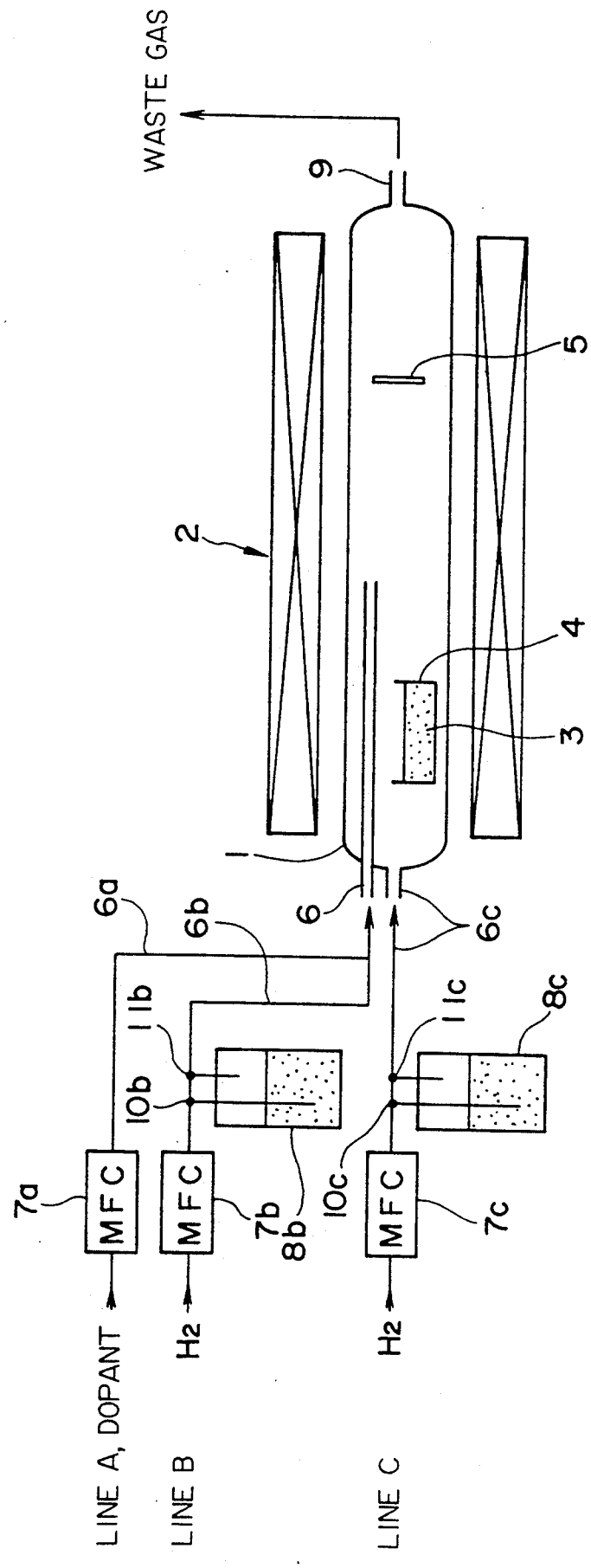
FIG. 1 is a schematic diagram of a vapor-phase epitaxial reactor system for use in EXAMPLES of an epitaxial process for a III-V compound semiconductor according to the present invention.

Vapor-phase epitaxy by the chloride CVD process typically involves the steps of feeding an epitaxial growth gas in such a manner that a crust forms over the surface of a melt in a boat for raw material, reacting on the crust a gas resulting from decomposition of the epitaxial growth gas to thereby obtain a reaction product, and transferring the reaction product to an epitaxial substrate to grow a layer of a III-V compound semiconductor by a reaction that is the reverse of the first reaction.

The epitaxial process for gallium-arsenide crystal by the chloride CVD process will be described by way of example. The epitaxial growth reaction by the typical chloride CVD process using hydrogen gas as a carrier gas decomposes arsenic trichloride gas (the epitaxial growth gas) to produce arsenic gas ($As_4$) and hydrogen chloride gas by the following reaction:

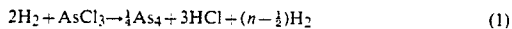
$$2H_2 + AsCl_3 \rightarrow \tfrac{1}{4}As_4 + 3HCl + (n - \tfrac{1}{2})H_2 \quad (1)$$

The hydrogen chloride gas then reacts on a crust of gallium arsenide on the surface of the raw material, producing gallium chloride (GaCl) and arsenic gas ($As_4$) by the following reaction:

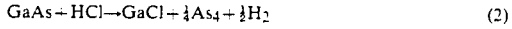
$$GaAs + HCl \rightarrow GaCl + \tfrac{1}{4}As_4 + \tfrac{1}{2}H_2 \quad (2)$$

The gallium chloride and arsenic gas ($As_4$) are transferred to the substrate for growing gallium arsenide thereon by a reaction reverse to the normal reaction of the reaction formula (2).

On the other hand, the epitaxial process of the present invention involves the step of reacting on a raw material in the boat for raw material a III group element derived from the epitaxial growth gas which has decomposed to produce a crust and consume the III group element, so that the partial pressure of the III group element is reduced and the epitaxial layer accordingly incorporates a larger amount of the impurity, thereby producing a δ-doped layer.

In accordance with an epitaxial growth reaction by the chloride CVD process of the present invention, the surface of the melted III group element in the boat for raw material appears after the buffer layer growing step, so that arsenic gas ($As_4$) derived from arsenic chloride gas reacts on gallium in the boat for raw material to produce a crust of gallium arsenide again to be consumed. The partial pressure of the arsenic gas ($As_4$) fed to the substrate is reduced, so that the partial pressure of hydrogen chloride gas is accordingly reduced. The rate of the normal reaction according the following reaction formula (3) is reduced as the partial pressure of hydrogen chloride gas is reduced:

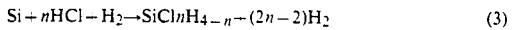
$$Si + nHCl + H_2 \rightarrow SiCl_nH_{4-n} + (2n-2)H_2 \quad (3)$$

Thus, the epitaxial layer accordingly incorporates a larger amount of silicon, thereby producing a δ-doped layer therein.

When the epitaxial layer is doped by silicon introduced through the third gas-introduction line and the doping time is too long, the carrier density profile is moderated and no δ-doped layer is produced. Thus, the doping time should be 10 seconds or less and preferably 1 second or less.

Since the flow control in the aforesaid doping process is difficult to conduct manually, a predetermined amount of a doping gas can be charged in a separate container or a separate gas-introduction line in advance and a valve for the container or gas introduction line be opened at a predetermined time by electronic control or a control means to quickly feed the doping gas to the substrate.

DESCRIPTION OF THE PREFERRED EMBODIMENTS

Preferred embodiments of the present invention will be described with reference to the drawings hereinafter.

EXAMPLE 1

FIG. 1 illustrates one example of a vapor-phase epitaxial reactor system for use in the vapor-phase epitaxial process of the present invention.

Figure 8:
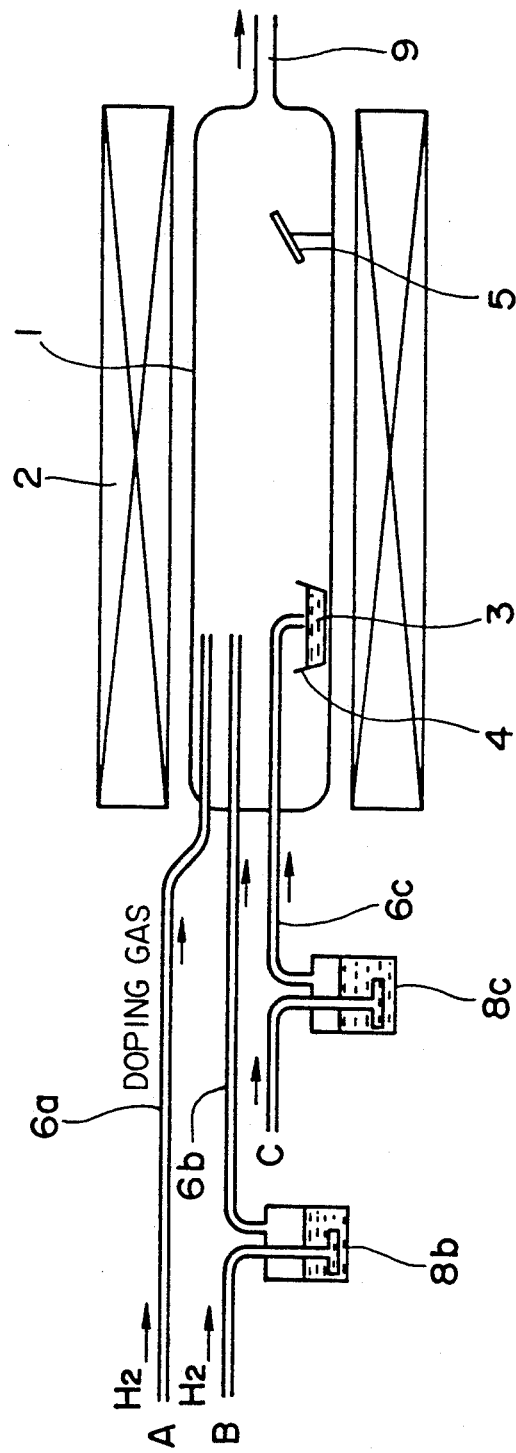
FIG. 8 is a schematic diagram of a vapor-phase epitaxial reactor system for use in a prior-art epitaxial process for a III-V compound semiconductor.
Figure 9:
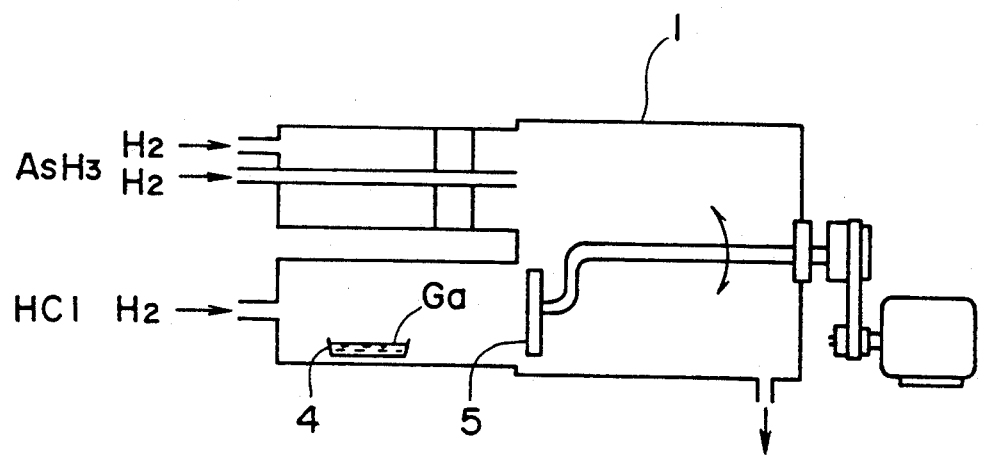
FIG. 9 is a schematic diagram of the main part of another vapor-phase epitaxial reactor system for use in a prior-art epitaxial process for a III-V compound semiconductor.

The vapor-phase epitaxial reactor system of FIG. 1 differs from that of FIG. 8 in that its electric furnace 2 is movable along the reactor vessel 1 in the form a horizontal cylindrical tube so that the reactor vessel 1 can be quickly cooled by exposure to room temperature and also in that respective connections between the gas introduction conduits 6b and 6c and the bubblers 8b and 8c have three-way valves 10b, 11b, 10c and 11c which allow hydrogen gas to be blown into liquid arsenic trichloride contained in the bubblers 8b and 8c. Depending on how the valves 10b, 11b, 10c and 11c are controlled, hydrogen gas flowing from the outside to the lines B and C either produces a mixture of arsenic trichloride gas and hydrogen gas ($AsCl_3 + H_2$) or is directly fed to the reactor vessel 1.

In EXAMPLE 1, the vapor-phase epitaxial reactor system was controlled by starting and stopping the feeding of gases through the three lines A, B and C to grow a layer of gallium arsenide including a δ-doped layer on an epitaxial substrate 5 of gallium arsenide. The procedure used in this control is shown in FIG. 3, in which the amounts shown in cc/min in the blocks indicate gas flows at room temperature.

Figure 2:
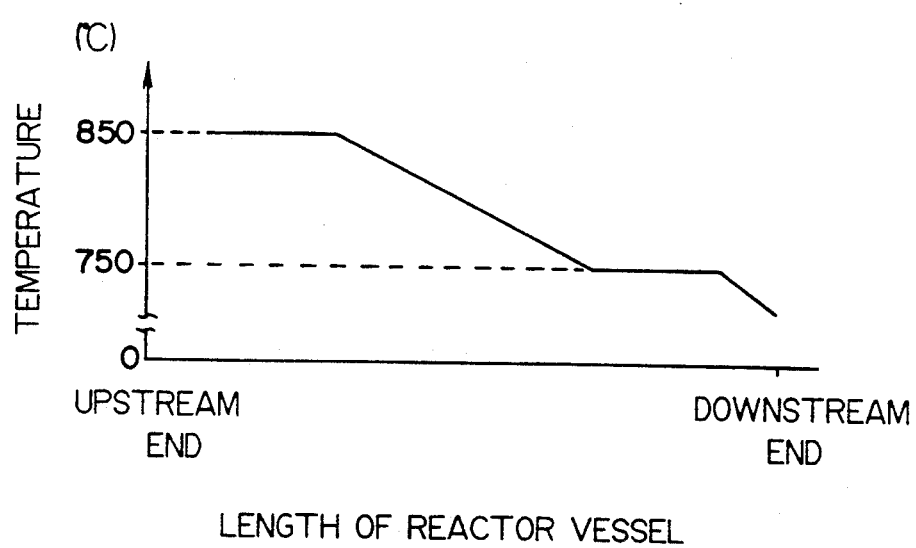
FIG. 2 is a graph showing the temperature distribution in a horizontal cylindrical reactor vessel of the vapor-phase epitaxial reactor system in EXAMPLES of the process according to the present invention.

More specifically, nitrogen gas was fed into the reactor vessel 1 through the lines B and C for a period from time $T_0$ to time $T_1$ to fully displace the gas contained in the reactor vessel 1 with nitrogen gas and then hydrogen gas was fed into the reactor vessel 1 through the same lines for a period from time $T_1$ to time $T_2$ to fully displace the nitrogen gas with hydrogen gas. Then, the electric furnace 2 was operated for holding a source of gallium 3 at 850° C. and the substrate 5 at 750° C., and producing a temperature distribution in the interior of the reactor vessel 1 as shown in FIG. 2.

From the time $T_2$, the lines B and C were used to feed a mixture of hydrogen gas and arsenic trichloride gas into the reactor vessel 1. As a result, arsenic gas ($As_4$) was dissolved to saturation in the gallium in the boat 4, producing a crust of gallium arsenide. Once the crust of gallium arsenide had come to fully cover the source of gallium 3, the crust of gallium arsenide reacted with hydrogen chloride gas to produce gallium chloride and arsenic gas (As$_4$), both of which were fed to the downstream substrate 5 to deposit gallium arsenide on the substrate 5 and thereby grow a layer of gallium arsenide thereon.

Once the layer of gallium arsenide had grown to a predetermined thickness, the gas feeds of the lines B and C were switched from the mixture of arsenic trichloride gas and hydrogen gas to hydrogen gas only at the time T$_3$. In this case, mass flow controllers 7b and 7c must be controlled to change the flows of the lines B and C if necessary. After a few minutes, arsenic (As) was driven out of the crust of gallium arsenide contained in the boat 4 and gallium increasingly appeared on the surface of the melt contained in the boat 4.

At time T$_4$, the line C was switched from hydrogen gas to a mixture of hydrogen gas and arsenic trichloride gas while the line B continue to feed hydrogen gas. The production of gallium arsenide crust in the boat 4 which began again immediately after the switching of the gas feed of the line C consumed arsenic vapor from the fed mixture of hydrogen gas and arsenic trichloride gas, so that the amount of arsenic vapor fed to the substrate 5 was reduced, thereby reducing the partial pressure of arsenic vapor. Thus, the epitaxial growth rate of the layer of gallium arsenide was reduced, excessively reducing the partial pressure of hydrogen chloride. As a result, silicon originating from the quartz reactor vessel 1 and constituting an impurity became inert to hydrogen chloride and was incorporated into the gallium-arsenide epitaxial layer in a larger amount. Once the crust of gallium arsenide fully covered the boat 4 holding gallium, it became more difficult for the gallium-arsenide epitaxial layer to incorporate silicon for producing a silicon doped layer doped in a δ-function deposition profile.

The line A was then used to feed 10 ppm of monosilane (SiH$_4$) diluted with hydrogen gas and constituting a doping gas, at time T$_5$. As a result, a layer of gallium arsenide of a constant n-type carrier density doped with silicon was epitaxially grown on the substrate 5.

Feeding of monosilane from the line A was stopped at time T$_6$ while the gas feed of the line C was switched from the gas mixture of arsenic trichloride gas and hydrogen gas to hydrogen gas only and the gas feed of the line B from hydrogen gas to the gas mixture of arsenic trichloride gas and hydrogen gas so that hydrogen chloride resulting from the thermal decomposition of the gas mixture of arsenic trichloride gas and hydrogen gas slightly etched back the layer of gallium arsenide epitaxially grown on the substrate 5. Alternatively, the line B could have been allowed to continue feeding hydrogen gas for a few seconds after the doping step stopped and then been switched to feed a gas mixture of arsenic trichloride gas and hydrogen gas.

The feed of the line B was switched from the gas mixture of arsenic trichloride gas and hydrogen gas to hydrogen gas only at time T$_7$ so as to displace the hydrogen chloride gas in the reactor vessel 1 acting as an etching gas with hydrogen gas. At time T$_8$, the system moved the electric furnace 2 towards the upstream (i.e., the left-hand end of FIG. 1) of the reactor vessel 1 and cooled the reactor vessel 1 by exposure to room temperature. The feeds of the lines B and C were switched from hydrogen gas to nitrogen gas at time T$_9$ to displace the gas in the reactor vessel 1 with nitrogen gas. The system removed the substrate 5 formed with a full gallium-arsenide epitaxial layer from the reactor vessel 1 at time T$_{10}$. Thus, the system completed one cycle for producing a substrate having a full gallium-arsenide epitaxial layer. In EXAMPLE 1, the bubblers 8b and 8c were held at 20° C. during the cycle.

Figure 4:
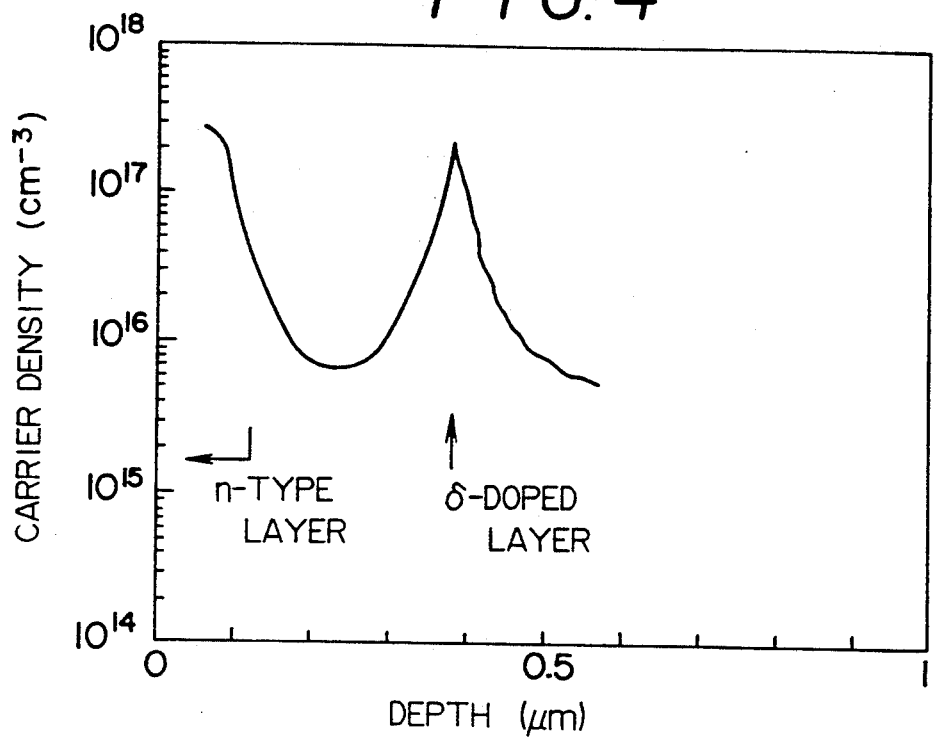
FIG. 4 is a graph of a carrier density distribution in an epitaxial layer produced by EXAMPLE 1 of the process according to the present invention.

The carrier density distribution of the so-produced gallium-arsenide epitaxial layer was measured by C-V measurement. FIG. 4 shows the result of this measurement. In FIG. 4 the x-axis represents the depth of the gallium-arsenide epitaxial layer and the y-axis the carrier density of the gallium-arsenide epitaxial layer.

Figure 5:
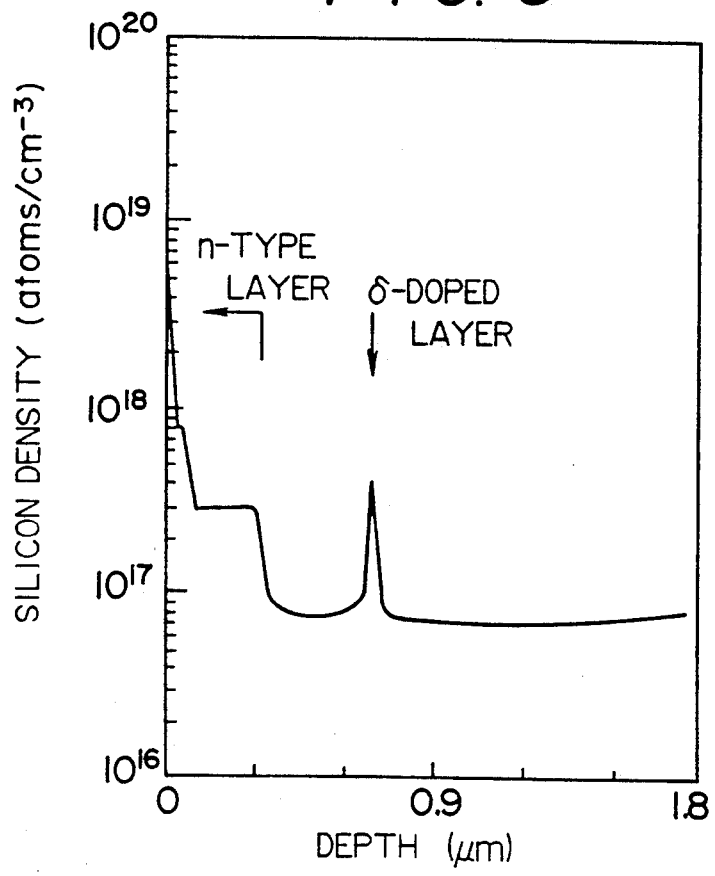
FIG. 5 is a graph showing the silicon density distribution in the same epitaxial layer.

FIG. 5 shows the silicon density distribution of the gallium-arsenide epitaxial layer of the same sample measured by SIMS (secondary ion-mass spectrography).

FIGS. 4 and 5 indicate that the process of EXAMPLE 1 can dope the gallium-arsenide epitaxial layer with silicon in the δ-function deposition profile and that silicon in the gallium-arsenide epitaxial layer serves as a donor.

In EXAMPLE 1, the δ-doped layer and then the n-type gallium-arsenide epitaxial layer were grown in order to facilitate the measurement of the carrier density and silicon density of the sample. However, not all substrates for actual semiconductor devices require an n-type gallium-arsenide epitaxial layer. An epitaxial process for the case where this layer is not required can be realized by eliminating the step between time T$_5$ and time T$_6$ of FIG. 3.

The timing and amounts of gas flow of the present invention are not limited to those of EXAMPLE 1 but may be appropriately selected for obtaining a desired carrier density profile.

EXAMPLE 2

EXAMPLE 2 differs from EXAMPLE 1 only in that the line C of EXAMPLE 2 fed monosilane as a doping gas at the time T$_4$ for only 1 second, whereby silicon was forcibly incorporated in the gallium-arsenide epitaxial layer. This caused EXAMPLE 2 to produce a δ-doped layer of a steeper carrier density profile.

Figure 6:
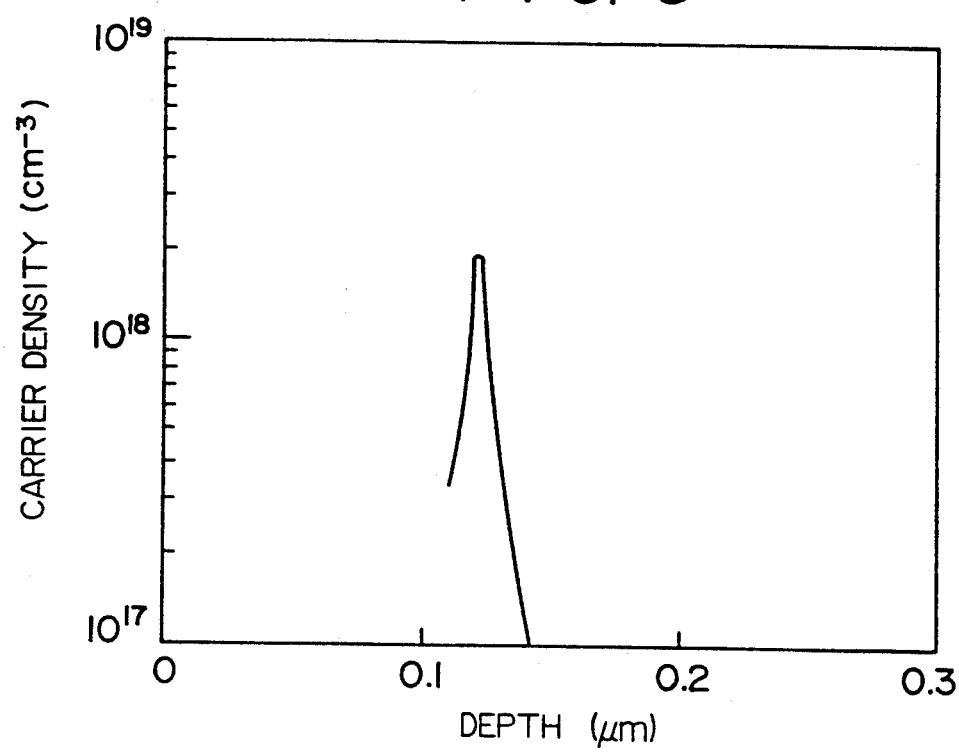
FIG. 6 is a graph showing the carrier density distribution in an epitaxial layer produced by EXAMPLE 2 of the process according to the present invention.
Figure 7:
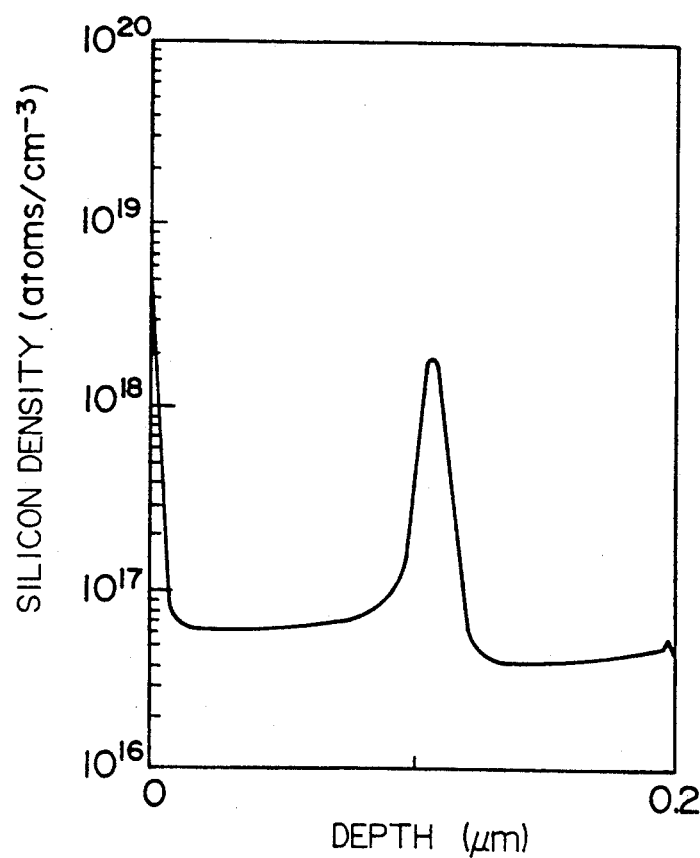
FIG. 7 is a graph showing the silicon density distribution in the same epitaxial layer.

FIG. 6 shows the carrier density distribution as obtained by C-V measurement of a gallium-arsenide epitaxial layer according to EXAMPLE 2 in which a doping gas was fed at 100 cc/min for only 1 second. FIG. 7 shows the silicon density distribution as measures by SIMS of the epitaxial layer of the same sample.

EXAMPLE 2 relates to a case in which silicon was used as a dopant. However, the present invention is not limited to the use of silicon a dopant but is applicable to cases in which the dopant is an impurity such as sulfur (S), selenium (Se), tellurium (Te) or tin (Sn).

The present invention is of course not limited to a vapor-phase epitaxial process for gallium-arsenide but is also applicable to vapor-phase epitaxial processes for gallium phosphide, indium phosphide and indium arsenide.

What is claimed is:

1. In an epitaxial process for a III-V compound semiconductor including the step of feeding an epitaxial growth gas into a reactor vessel containing a III group element as a raw material source and a substrate made of a semiconductor to epitaxially grow a layer of the III-V compound semiconductor on the substrate by a chloride CVD process, said epitaxial process further comprising the steps of:

(a) displacing a gas in an interior of the reactor vessel with an inert gas;

(b) feeding a chloride of a V group element as the epitaxial growth gas to grow a buffer layer on the substrate;

(c) interrupting the feed of the epitaxial growth gas;

(d) feeding only a carrier gas to a boat holding the raw material source in the reactor vessel for causing a melt of the III group element to appear on a surface of a melt in the boat; and (e) feeding the epitaxial growth gas into the reactor vessel to grow the layer of III-V compound semiconductor doped with an impurity in a δ-function deposition profile.

2. An epitaxial process for a III-V compound semiconductor conducted in a vapor-phase epitaxial reactor system including, a reactor vessel containing a III group element constituting a raw material and a substrate of a semiconductor, a boat for holding the III group element, a first gas-introduction line feeding an epitaxial growth gas to the boat, a second gas-introduction line bypassing the boat and feeding an etching gas to the substrate, and a third gas-introduction line feeding a doping gas to the substrate, said epitaxial process comprising the steps of:

(a) displacing a gas contained in the reactor vessel with an inert gas;

(b) feeding a chloride of a V group element as the epitaxial growth gas entrained by a carrier gas to the substrate through the first and second gas-introduction lines to grow a buffer layer on the substrate;

(c) interrupting the feeding of the epitaxial growth gas;

(d) feeding only the carrier gas into the reactor vessel for causing a melt of the III group element to appear on a surface of a melt held in the boat; and (e) feeding the epitaxial growth gas to the substrate through the first gas-introduction line to grow the III-V compound semiconductor doped with an impurity in a δ-function deposition profile.

3. The epitaxial process of claim 2, further comprising the step of:

(f) feeding the doping gas to the substrate through the third gas-introduction line for a short time after said step (e) starts and after said step (d).

4. The epitaxial process of claim 1, wherein the III-V compound semiconductor is gallium arsenide, gallium phosphide, indium phosphide, or indium arsenide.

5. The epitaxial process of claim 1, wherein the impurity is sulfur, selenium, tellurium, tin, or silicon.

6. The epitaxial process of claim 1, wherein the impurity is silicon originating from the reactor vessel.

7. The epitaxial process of claim 1, wherein a doping time is 10 seconds or less.

8. The epitaxial process of claim 7, wherein the doping time is 1 second or less.

9. The epitaxial process of claim 6, wherein the silicon in the III-V compound semiconductor serves as a donor.

10. The epitaxial process of claim 2, wherein the III-V compound semiconductor is gallium arsenide, gallium phosphide, indium phosphide, or indium arsenide.

11. The epitaxial process of claim 2, wherein the impurity is sulfur, selenium, tellurium, tin, or silicon.

12. The epitaxial process of claim 2, wherein the impurity is silicon.

13. The epitaxial process of claim 12, wherein a doping time is 10 seconds or less.

14. The epitaxial process of claim 13, wherein the doping time is 1 second or less.

15. The epitaxial process of claim 12, wherein the silicon in the III-V compound semiconductor serves as a donor.

* * * * *